United States Patent
Kambara et al.

(10) Patent No.: US 8,078,428 B2
(45) Date of Patent: Dec. 13, 2011

(54) DELAY VARIATION ANALYSIS APPARATUS AND DELAY VARIATION CALCULATION METHOD

(75) Inventors: Fumi Kambara, Kawasaki (JP); Yuji Yoshida, Kawasaki (JP); Sugio Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 272 days.

(21) Appl. No.: 12/453,357

(22) Filed: May 7, 2009

(65) Prior Publication Data
US 2010/0030516 A1    Feb. 4, 2010

(30) Foreign Application Priority Data
Jul. 31, 2008 (JP) .................................. 2008-198869

(51) Int. Cl.
*G06F 17/18* (2006.01)
(52) U.S. Cl. ...................................................... 702/179
(58) Field of Classification Search .................. 702/179, 702/79, 118, 125, 176
See application file for complete search history.

(56) References Cited

U.S. PATENT DOCUMENTS

| | | | | |
|---|---|---|---|---|
| 2004/0167756 A1* | 8/2004 | Yonezawa | ......................... | 703/2 |
| 2005/0010883 A1* | 1/2005 | Wood | ................................ | 716/6 |
| 2006/0059446 A1* | 3/2006 | Chen et al. | ........................ | 716/6 |
| 2006/0225014 A1* | 10/2006 | Hosono | ............................. | 716/6 |
| 2008/0066025 A1* | 3/2008 | Tanaka | .............................. | 716/4 |

FOREIGN PATENT DOCUMENTS

JP    2005-11892    1/2005

OTHER PUBLICATIONS

Izumi Nitta, et al., "A Study of the Model and the Accuracy of Statistical Timing Analysis," IEICE Technical Report (Institute of Electronics, Information and Communication Engineers), vol. 105, No. 448 (DC2005 38-52); Dec. 2005, pp. 61-66, Abstract only.

* cited by examiner

*Primary Examiner* — Michael Nghiem
*Assistant Examiner* — Paul D Lee
(74) *Attorney, Agent, or Firm* — Staas & Halsey LLP (57) ABSTRACT

A method for analyzing a delay time distribution of an N-stage circuit. The method includes a delay time calculation step of calculating maximum deviation delay time of a signal propagating through the circuit and basic delay time of the circuit, a delay variation calculation step of calculating a delay variation value of the N-stage circuit by using the mean square of differences between the maximum deviation delay time of the circuit and the basic delay time of the circuit taken over the N stages, and a step of generating the delay time distribution of the N-stage circuit as a normal distribution by using the calculated delay variation value.

12 Claims, 10 Drawing Sheets

FIG.3

| NUMBER | KIND | GATE LENGTH (L) | GATE WIDTH (W) | THRESHOLD VOLTAGE (Vth) | GATE LENGTH VARIATION (+3σ) | GATE LENGTH VARIATION (-3σ) | GATE WIDTH VARIATION (+3σ) | GATE WIDTH VARIATION (-3σ) | THRESHOLD VOLTAGE VARIATION (+3σ) | THRESHOLD VOLTAGE VARIATION (-3σ) |
|---|---|---|---|---|---|---|---|---|---|---|
| A1-1 | PMOS | 0.13um | 1.0um | 0.7V | 0.01um | 0.01um | 0.03um | 0.04um | 0.01V | 0.01V |
| A1-2 | PMOS | 0.13um | 1.0um | 0.7V | 0.01um | 0.01um | 0.03um | 0.04um | 0.01V | 0.01V |
| A1-3 | NMOS | 0.13um | 1.3um | 0.2V | 0.01um | 0.01um | 0.03um | 0.04um | 0.015V | 0.015V |
| A1-4 | NMOS | 0.13um | 1.3um | 0.2V | 0.01um | 0.01um | 0.03um | 0.04um | 0.015V | 0.015V |

DELAY VARIATION ANALYSIS APPARATUS AND DELAY VARIATION CALCULATION METHOD

CROSS-REFERENCE TO RELATED APPLICATION(S)

This application is based upon and claims the benefit of priority of the prior Japanese Patent Application No. 2008-198869, filed on Jul. 31, 2008, the entire contents of which are incorporated herein by reference.

FIELD

The present invention relates to a delay variation analysis apparatus and a delay variation analysis method.

BACKGROUND

In recent years, with increasing miniaturization or integration of semiconductor integrated circuits (hereinafter called LSIs), the degree of effect that manufacturing variations and variations in process, temperature, voltage, etc. have on delay times has been increasing, and such variations have come to affect manufacturing yields. That is, the growing variations in delay time (hereinafter called "delay variations") caused by the above-mentioned variations have come to greatly affect the design times and manufacturing yields of LSIs. Accordingly, in the development of an LSI, in order to achieve the desired yield, circuit delay analysis is conducted by calculating signal delay times for the worst-case device variations.

Usually, static timing analysis (STA) is employed for such analysis. In STA, the worst-case signal delay time of the circuit is calculated using the worst-case signal delay time of each device by assuming that every device introduces the worst-case signal delay time.

Generally, in the development of an LSI, the LSI is designed based on circuit cells as logic devices or circuit macro cells and the macro cells have an internal circuit constructed from logic devices. Examples of the circuit cells as logic devices include inverter (NOT logic) circuit cells, AND circuit cells, OR circuit cells, etc., and examples of the circuit cells having internal circuits include D-latch circuit cells, incremental circuit cells, counter circuit cells, etc. Accordingly, in the STA of an LSI, it is standard practice to calculate the worst-case signal delay time of the circuit using the worst-case signal delay time of each circuit cell by assuming that every circuit cell introduces the worst-case signal delay time.

However, with the design method using the STA that assumes the case where every circuit cell introduces the worst-case signal delay time, signal delays tend to be overestimated; accordingly, with increasing miniaturization or integration of LSIs, it has become increasingly difficult to achieve the design that satisfies the desired performance.

Up to now, there is proposed a method that uses a statistical analysis technique, such as Monte Carlo analysis, for calculation of the delay variations caused by manufacturing variations, etc. In this former method, the probability distribution of device signal delay times (hereinafter called the "delay time distribution") is obtained using Monte Carlo analysis by randomly setting process characteristics such as transistor gate length, etc., and the manufacturing yield is obtained from the delay time distribution. Since the relationship between process variables and delay yields is accurately determined by Monte Carlo analysis, optimum design margins for achieving the desired yield can be obtained.

There is also proposed a method that uses statistical static timing analysis (SSTA), a technique for calculating the delay time distribution of a circuit by statistically handling the signal delay time of each device as a probability distribution, and that obtains the delay time distribution of the circuit by constructing the delay time distribution from the process characteristics such as the gate width of each device, interconnects, etc.

Japanese Laid-open Patent Publication No. 2005-11892 is disclosed. Izumi Nitta, Katsumi Homma, and Toshiyuki Shibuya, "A Study of the Model and the Accuracy of Statistical Timing Analysis," Technical Report of IEICE, pp. 61-66, December 2005 is disclosed.

SUMMARY

According to an aspect of the invention, a method for analyzing a delay time distribution of an N-stage circuit includes a delay time calculation step of calculating maximum deviation delay time of a signal propagating through the circuit and basic delay time of the circuit, a delay variation calculation step of calculating a delay variation value of the N-stage circuit by using the mean square of differences between the maximum deviation delay time of the circuit and the basic delay time of the circuit taken over the N stages, and a step of generating the delay time distribution of the N-stage circuit as a normal distribution by using the calculated delay variation value.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENT(S)

Excessive design margins, a problem inherent in STA, can be optimized using SSTA. To perform an analysis using SSTA, the delay time distribution of each circuit cell is obtained. Ideally, the delay time distribution of each circuit cell is obtained using Monte Carlo analysis, but it would take an enormous amount of processing time to perform Monte Carlo analysis on each circuit cell; besides, the amount of analysis data amount would also become enormous. Performing Monte Carlo analysis on all the circuit cells would be impracticable as it would require a huge amount of time and data in the design of LSIs that have high levels of integration and that need fast time-to-market.

The present invention is directed to the provision of a delay variation analysis apparatus and method for obtaining the delay time distributions of circuit cells in order to design an LSI circuit with optimum design margins by using SSTA.

The method of the invention can generate the delay time distribution of each circuit and can analyze the delay time distribution of the circuit in a simple manner without having to analyze the circuit by using the Monte Carlo method.

Embodiments of the present invention will be described below with reference to the accompanying drawings.

Figure 1:
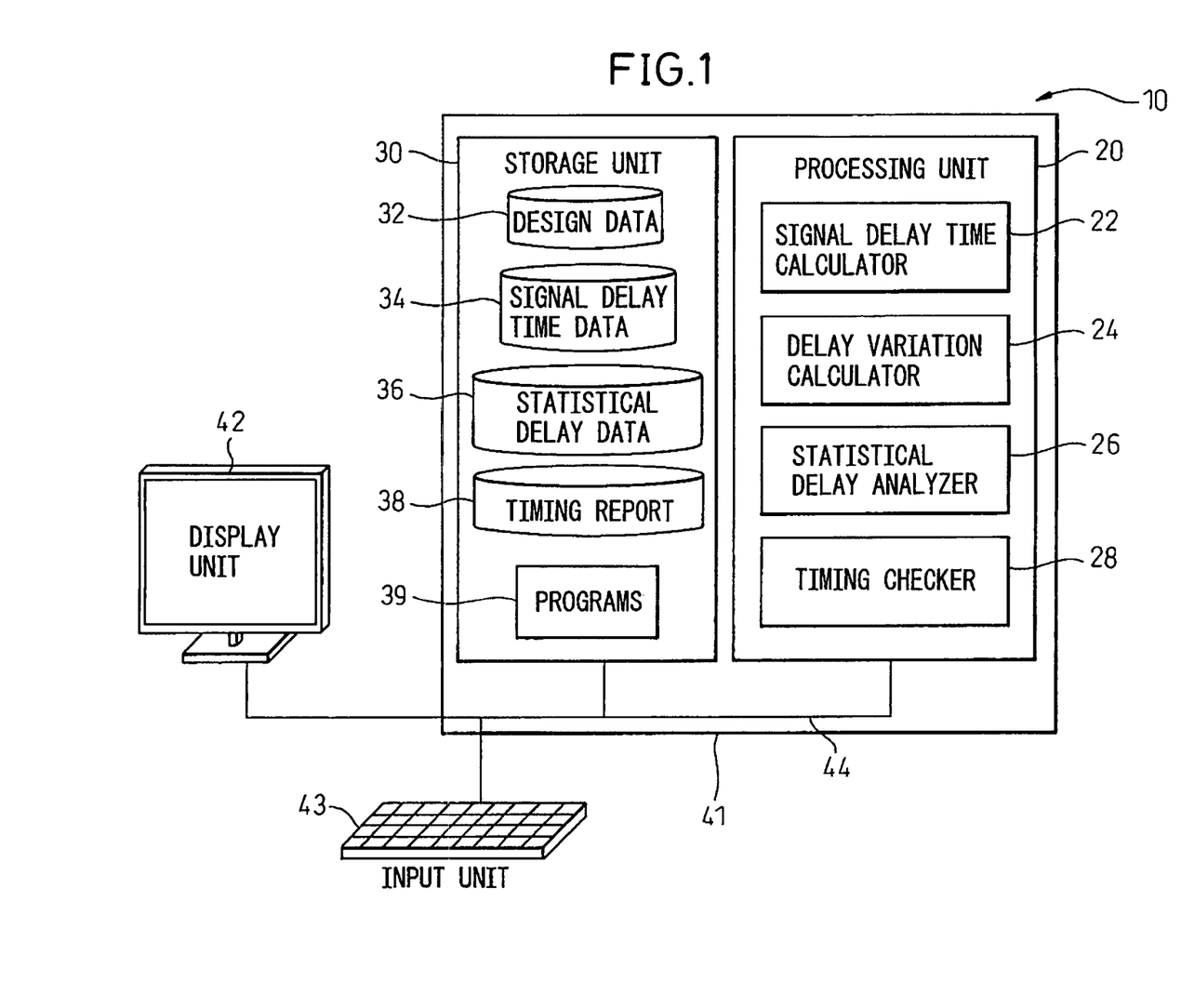
FIG. 1 is a diagram illustrating one example of a delay variation analysis apparatus.

FIG. 1 illustrates one example of a method and apparatus for calculating in a simple manner the signal delay time distribution of a circuit constructed from a plurality of devices using the delay distribution of the device. The delay variation analysis apparatus 10 comprises a processing unit 20, a storage unit 30, a display unit 42, and an input unit 43; these component elements of the apparatus 10 are interconnected via a bus. The term "device" used herein also includes a "circuit cell" as an example of a "device".

The processing unit 20 can be implemented using a single processor or a plurality of processors. Such a processor may include a central processing unit (CPU), a programmable logic device, a digital signal processor (DSP), a field programmable gate array (FPGA), etc.

The processing unit 20 can perform control to execute programs, etc. stored in the storage unit 30, to input and output various kinds of data to and from the storage unit 30, to store information entered from the input unit 43 into the storage unit 30, and to display results of delay variations, etc. on the display unit 42.

Further, the processing unit 20 can function as a signal delay time calculator 22, a delay variation calculator 24, a statistical delay analyzer 26, and a timing checker 28.

The signal delay time calculator 22 can calculate the signal delay time of each device contained in the circuit. Using the signal delay time calculated by the signal delay time calculator 22, the delay variation calculator 24 can calculate delay variations of an N-stage circuit cell and the probability distribution of the delay variations (hereinafter called the "delay time distribution"). Using the delay time distribution of the N-stage circuit cell calculated by the delay variation calculator 24, the statistical delay analyzer 26 statistically calculates the delay time distribution of the circuit having a plurality of N-stage circuit cells. The timing checker 28 can output the delay time distribution of the N-stage circuit cell calculated by the delay variation calculator 24 or the delay time distribution of the circuit calculated by the statistical delay analyzer 26 to the display unit 42, etc.

Various kinds of data to be used by the processing unit 20 are stored in the storage unit 30. For example, design data 32 that defines circuit structure definition information and device process characteristics, signal delay time data 34 that stores the signal delay times within the range ±3σ calculated for each kind of device by the signal delay time calculator 22, statistical delay data 36 that stores the delay variations of the circuit calculated by the delay variation calculator 24, and a timing report 38, as well as the programs (operating system, applications, etc.) and firmware for implementing the sequences of operations to be executed by the processing unit 20, are stored in the storage unit 30.

By executing the programs stored in the storage unit 30, the processing unit 20 can function as the signal delay time calculator 22, the delay variation calculator 24, the statistical delay analyzer 26, and the timing checker 28.

The storage unit 30 can be constructed using, for example, a non-volatile storage device (non-volatile semiconductor memory, hard disk device, optical disk device, flash memory, etc.), a random-access storage device (SRAM, DRAM, etc.), a read-only memory, or the like.

When the user operates a keypad, the input unit 43 generates a signal corresponding to the operation, and supplies the signal as a user instruction to the processing unit 20. The display unit 42 is constructed using, for example, a display device such as a liquid crystal display (LCD) panel or an organic Electro Luminescence (EL) panel, and displays text or an image in response to the signal supplied from the processing unit 20.

Figure 2:
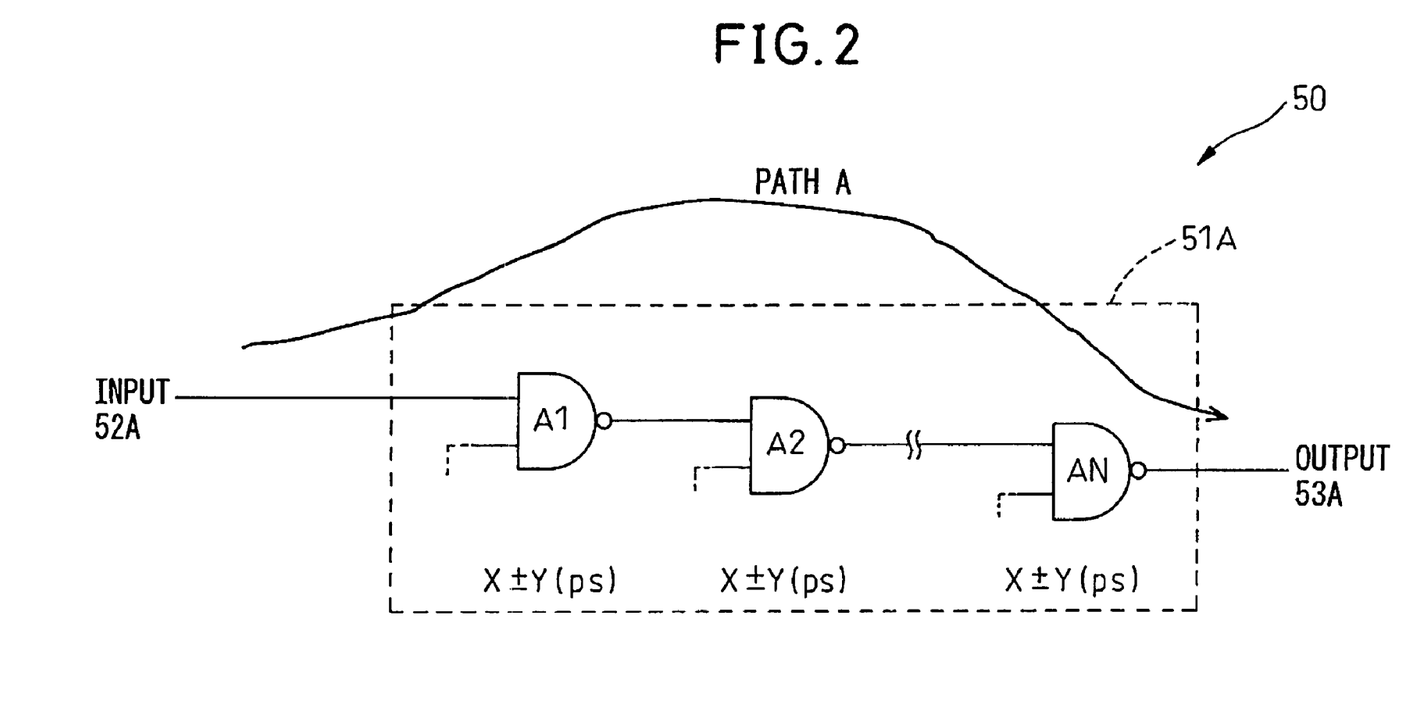
FIG. 2 is a diagram illustrating one example of design data whose delay variations are to be calculated.

One example of the N-stage circuit cell whose delay variations are to be calculated by the delay variation analysis apparatus will be described with reference to FIG. 2.

The N-stage circuit cell 50 includes a circuit path 51A that contains NAND gate devices, A1, A2, . . . , and AN, and other logic gate devices such as OR gates and inverters not illustrated. A signal from an input 52A is passed through the NAND gate devices, etc. in the circuit path 51A and conducted to an output 53A.

The design data that defines the process characteristics of the devices illustrated in FIG. 2 will be explained with reference to FIG. 3.

As illustrated in the process characteristic data 60, the process characteristics of the NAND gate device A1, for example, are defined in terms of the gate length L, gate width W, threshold voltage Vth, process variation characteristic data, etc. of the MOS (Metal Oxide Semiconductor) device forming the NAND gate device A1.

Though not illustrated here, circuit description data that defines a plurality of circuit paths is also included in the design data 32.

Figure 4:
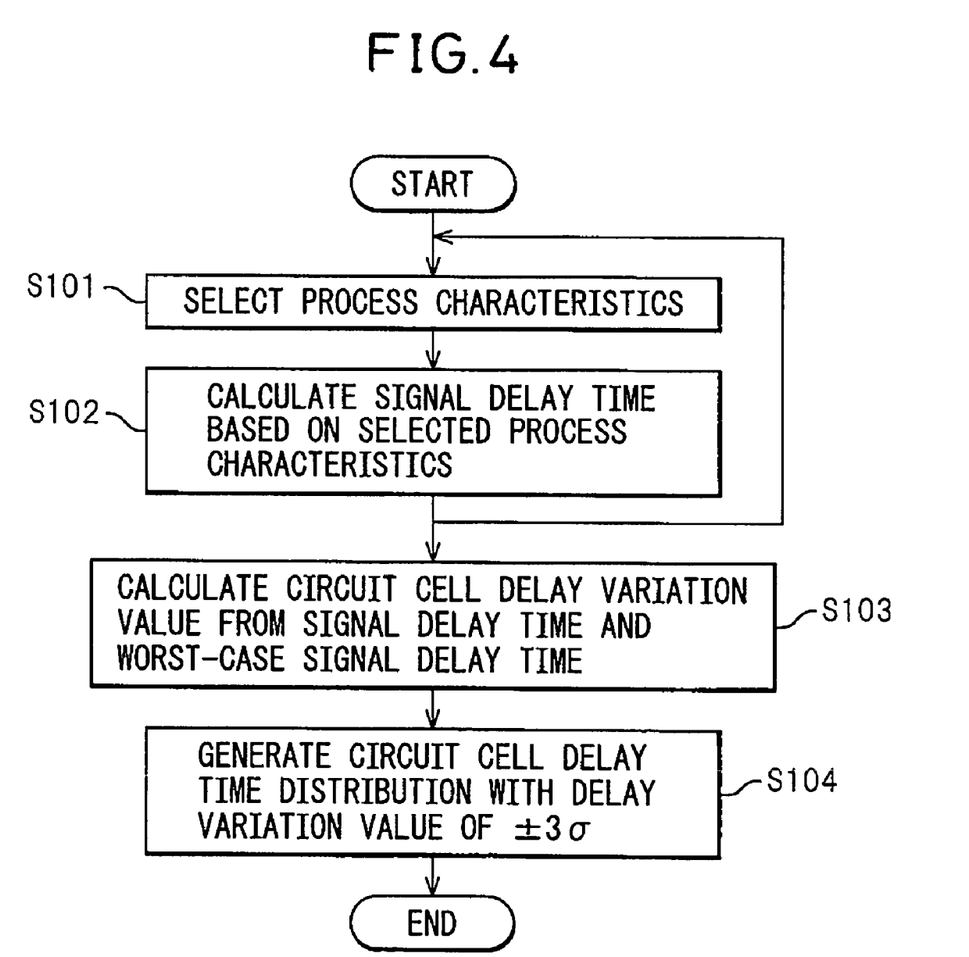
FIG. 4 is a flowchart illustrating one example of a signal delay time and delay variation calculation process performed by the delay variation analysis apparatus.

One example of a process flow for calculating the delay variations of the N-stage circuit cell by the delay variation analysis apparatus 10 will be described with reference to FIG. 4.

Figure 3:
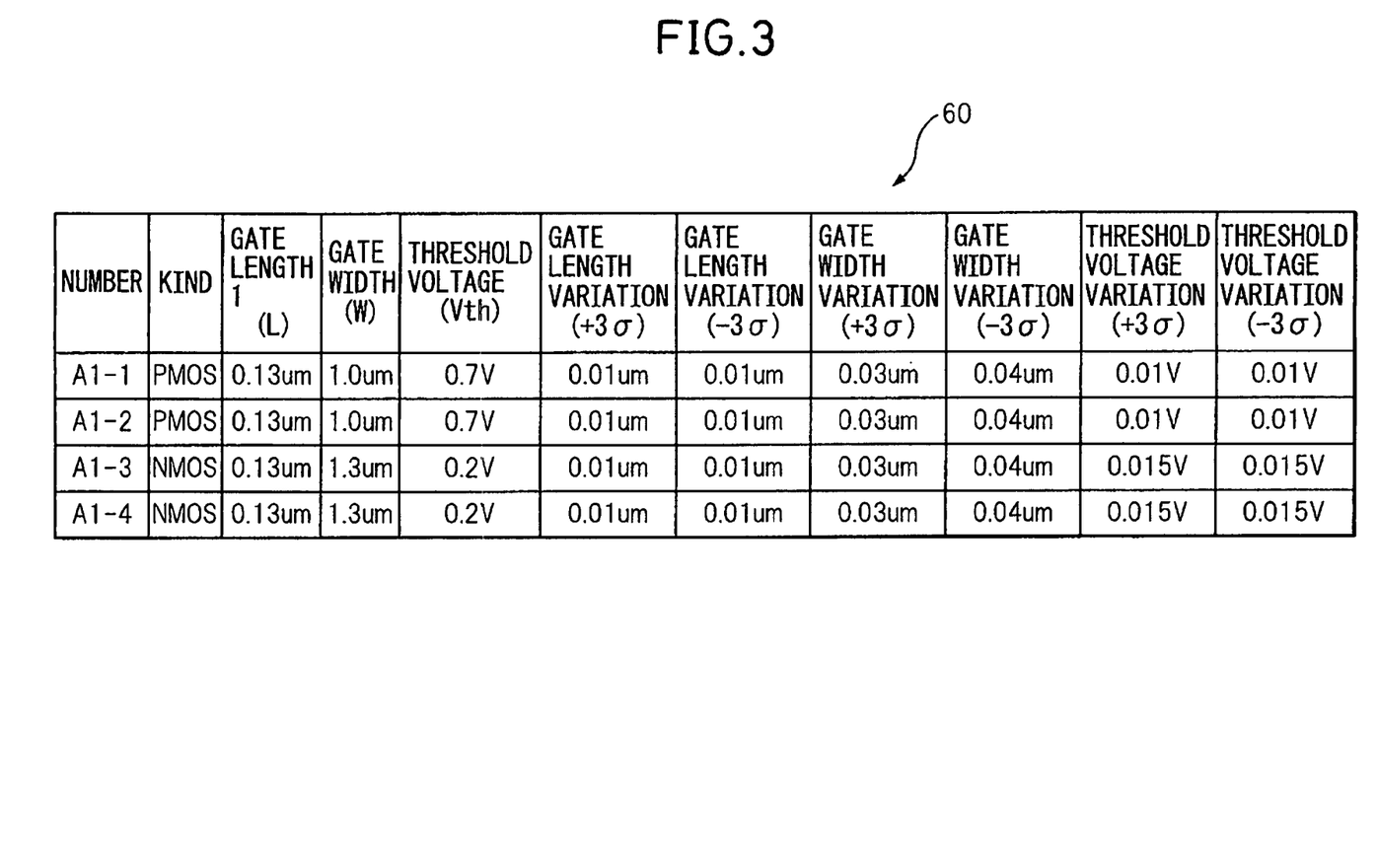
FIG. 3 is a diagram illustrating one example of process characteristic data.

First, the signal delay time calculator 22 acquires from the design data 32 the device process characteristic information illustrated in FIG. 3 (step S101). The designer selects suitable process information by considering the typical process characteristics when the signal delay time exhibits a mean value, such as standard voltage value, when calculating the basic signal delay time, the process characteristics within ±3σ when calculating the worst-case signal delay time, and other conditions such as systematic variations and random variations (to be described later), and sets them as the set values that the signal delay time calculator 22 uses for calculation.

The signal delay time calculator 22 calculates the signal delay time of the circuit cell using a circuit operation simulator (such as SPICE), based on the acquired process characteristics and the circuit description contained in the design data 32 (step S102). Since three kinds of delay times, the basic signal delay time and the worst-case slow and fast signal delay times, are preferably in order to obtain the delay time, distribution, the preferable data is calculated by repeating the steps S101 and S102.

The signal delay time calculator 22 takes the delay time in the case of the typical process characteristics, such as described above, as the basic signal delay time $X_0$ and the signal delay times due to the process characteristic variations of ±3σ as the worst-case signal delay times $X_N$, and stores them as the signal delay time data 34 in the storage unit 30.

The delay variations of the N-stage circuit cell are classified into systematic delay variations (hereinafter called the "systematic variations") that occur when the process characteristics that affect the delay have varied in a similar manner and random delay variations (hereinafter called the "random variations") that occur when the process characteristics that affect the signal delay have varied in a random manner.

The delay variation calculator 24 obtains the systematic delay variation value of the circuit cell 51A in accordance with Equation 2 below by using the basic signal delay time $X_0$ and the difference value Y between the basic signal delay time $X_0$ and the worst-case signal delay time $X_N$ calculated from the process characteristics corresponding to the systematic variations (step S103). The delay variation value here refers to the ratio of the difference between the maximum deviation delay time of the circuit cell and the basic delay time of the circuit cell to the basic delay time.

In the systematic variations, since the process characteristics vary in a systematic manner, the worst-case signal delay time $X_N$ can be regarded as the maximum deviation signal delay time $X_{3\sigma}$. Further, the delay variation calculator 24 obtains the random delay variation value of the N-stage circuit cell 51A in accordance with Equation 9 below by using the basic signal delay time $X_0$ and the worst-case signal delay time $X_N$ calculated from the basic signal delay time $X_0$ and the process characteristics corresponding to the random variations (step S103). In FIG. 4, the systematic delay variations and the random delay variations are together referred to as the "delay time distribution".

Systematic signal delay time difference value:

$$Y_s = X_{3\sigma} - X_0 \ldots \quad \text{(Equation 1)}$$

Systemic delay variation value:

$$V_S = \frac{Y_S}{X_0} = \frac{X_{3\sigma} - X_0}{X_0} \quad \text{(Equation 2)}$$

Maximum deviation signal delay time for one stage:

$$X1 = X1_0 \pm Y1 \quad \text{(Equation 3)}$$

Random mean signal delay time for N stages:

$$X_0 = N \cdot X1_0 \quad \text{(Equation 4)}$$

Random maximum deviation signal delay time for N stages:

$$X_{3\sigma} = N \cdot X1_0 \pm Y_R \quad \text{(Equation 5)}$$

Random worst-case signal delay time for N stages:

$$X_N = N \cdot X1 = N \cdot X1_0 \pm N \cdot Y1 \quad \text{(Equation 6)}$$

Random signal delay time difference value for N stages:

$$Y_R = \frac{N \cdot Y1}{\sqrt{N}} \quad \text{(Equation 7)}$$

From Equations 3 to 7:

$$Y_R = \frac{X_N - X_0}{\sqrt{N}} \quad \text{(Equation 8)}$$

Random delay variation value for N stages:

$$V_R = \frac{Y_R}{X_0} = \frac{X_N - X_0}{\sqrt{N} \cdot X_0} \quad \text{(Equation 9)}$$

Next, a description will be given of how Equation 2 used to obtain the systematic delay variation value of the N-stage circuit cell 51A is derived from Equation 1.

Equation 1 is an equation for obtaining the difference value $Y_S$ between the basic signal delay time $X_0$, which is the signal delay time in the case of zero variations, and the maximum deviation signal delay time $X_{3\sigma}$ that occurs when the process has varied systematically by an amount of 3σ. In the systematic variations, since the characteristics of all the devices vary in a similar manner as earlier described; the worst-case signal delay time $X_N$ properly represents the tendency of the systematic variations. The systematic delay variation value $V_S$ is given as the ratio of the delay time difference value $Y_S$ to the basic signal delay time $X_0$, as illustrated by Equation 2.

Next, a description will be given of how Equation 9 used to obtain the random delay variation value of the N-stage circuit cell 51A is derived from Equations 3 to 8. The random delay variations that occur when the process characteristics vary in a random manner generally have the characteristic that the delay variations decrease as the number of stages increases. Accordingly, the number of gate stages contained in the circuit becomes an important factor when calculating the random delay variation value. The number of stages, or the number of devices, contained in the circuit path 51A is denoted by N, and the basic signal delay time $X_0$ is taken to represent the basic signal delay time for the N stages, while the worst-case signal delay time $X_N$ is taken to represent the worst-case signal delay time for the N stages. Here, for simplicity, it is assumed that the delay time is the same for each stage, and the basic signal delay time of one stage is denoted by $X1_0$ and the worst-case signal delay time of one stage by $X1$.

The basic signal delay time calculated for the case of the random variations by the signal delay time calculator 22 is given by Equation 4. Equation 3 represents the maximum signal deviation time for one stage, which can be assumed to be equal to the worst-case signal delay time $X1$. The maximum deviation signal delay time calculated for the case of the random variations by the signal delay time calculator 22 is given by Equation 5. Here, note the difference $Y_R$ from the basic signal delay time $X_0$. Equation 6 represents the worst-case signal delay time $X_N$ calculated by the signal delay time calculator 22. However, Equation 6 does not reflect the characteristic of the random variations that the delay variations decrease as the number of stages increases. This means that the worst-case signal delay time calculated for the case of the random variations by the signal delay time calculator 22 is overestimated if it is taken as the maximum deviation signal delay time.

Accordingly, in the present embodiment, the difference value $Y_R$ between the basic signal delay time and the maximum deviation signal delay time of the N-stage circuit cell, which occurs as a result of propagation through the circuit path, is calculated as the mean square of the per-stage difference value $Y1$ taken over the N stages in accordance with the "error propagation rule" that is used to estimate error propagation when a plurality of errors propagate in a successive manner.

In the present embodiment, since the signal delay time difference value $Y_R$ of the circuit path is calculated as the mean square of the difference value Y1, the difference value $Y_R$ is given by Equation 7. In Equation 8, $Y_R$ is expressed using $X_0$ and $X_N$. Hence, the random delay variation value of the circuit path 51A having N stages of devices can be derived as illustrated by Equation 9.

Further, as illustrated in the right-hand side of Equation 9, the delay variation value of the circuit path is expressed by a fraction whose denominator contains the square root of N. As a result, in Equation 9, as the value of N increases, the effect that an error in determining the number of stages may have on the delay variation value decreases. This means that when the number of stages in the circuit cell is large, if the accuracy of the value of N used for the calculation of the delay variation value somewhat drops, it may not have a significant effect on the calculation result of the delay variation value.

Accordingly, while it is desirable to calculate the value of N by counting the number of stages along the path for which the delay variation value is to be calculated, the calculator 24 can obtain the number of stages, N, by dividing the basic signal delay time of the circuit path 51A, calculated by the signal delay time calculator 22, by the average signal delay time per stage. In this case, the delay variation value of the N-stage circuit cell can be obtained without having to count the number of stages, N, one by one.

In the delay variation calculator 24, the signal delay time of the logic gate device most frequently used in the integrated circuit 50 or in the circuit path 51A can be used as the per-stage signal delay time, based on the design data 32. The designer can determine which data, the data of the integrated circuit 50 or the data of the circuit path 51A, is to be used for the calculation of the per-stage signal delay time. In the former case, there is offered the advantage that the signal delay time calculated here can be used when estimating the number of stages, N, for all the circuit paths contained in the integrated circuit 50. In the latter case, since the number of stages, N, is estimated specifically for the circuit 51A, the accuracy of the value of N for the circuit path 51A is higher than in the former case.

The delay variation calculator 24 can also calculate the basic delay time by summing the basic delay times of all the logic gate devices in the integrated circuit 50 or in the circuit path 51A, based on the design data 32, and use it as the per-stage signal delay time. In this case also, the delay variation value of the N-stage circuit cell can be obtained without having to count the number of stages, N, one by one, and the designer can determine which data, the data of the integrated circuit 50 or the data of the circuit path 51A, is to be used. For example, the designer can determine the number of stages, N, by dividing the total signal delay time of the N-stage circuit cell by the signal delay time of a circuit cell having the longest signal delay time or the signal delay time of a kind of circuit cell largest in number.

As described above, according to the present embodiment, the delay variation value of the N-stage circuit cell can be obtained in a further simple manner.

The delay variation value of the circuit path 51A is included in the statistical delay data 36. The delay variation values of all the circuit paths for the case of the systematic variations as well as for the case of the random variations are also included in the statistical delay data 36.

Figure 5A:
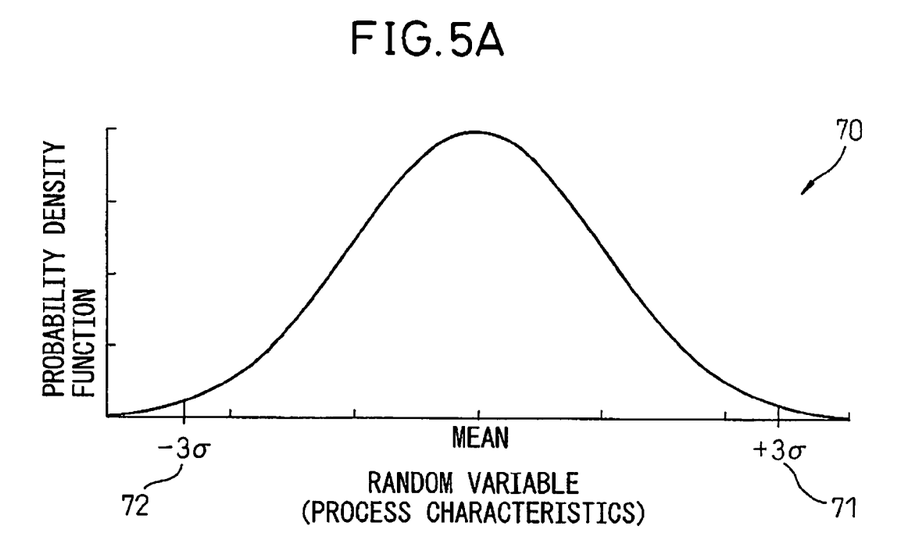
FIG. 5A is a diagram illustrating one example of a normal distribution with process characteristics as a random variable.
Figure 5B:
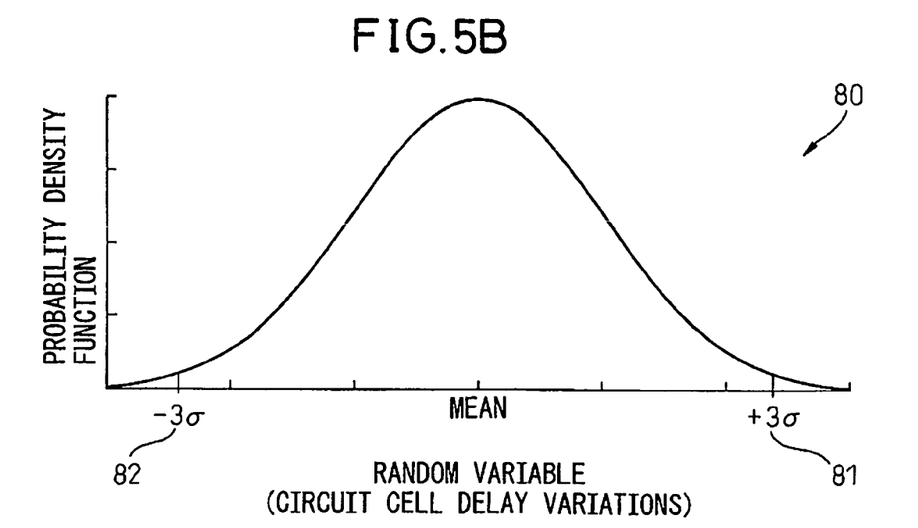
FIG. 5B is a diagram illustrating one example of a normal distribution with delay variations as a random variable.

The statistical delay analyzer 26 generates the delay time distribution which is a normal distribution with the statistical delay data 36 as a random variable of $\pm 3\sigma$ (step S104). FIG. 5(b) illustrates one example of the probability density function of the delay variations as the delay time distribution. The basic delay time corresponds to the mean value in FIG. 5(b). The statistical delay analyzer 26 takes the design data 32, signal delay time data 34, and statistical delay data 36 as input data, and performs the delay analysis of the integrated circuit 50 by using SSTA.

By outputting the results of the calculations performed by the statistical delay analyzer 26 for display on the display unit 42, the timing checker 28 can present the relationship between the delay time and yield of the integrated circuit 50 (see FIG. 9), the path delay time distribution, etc. to the operator performing the LSI design. The user who performs the LSI design based on circuit cells can thus check whether or not the integrated circuit 50 satisfies the desired yield.

Figure 6:
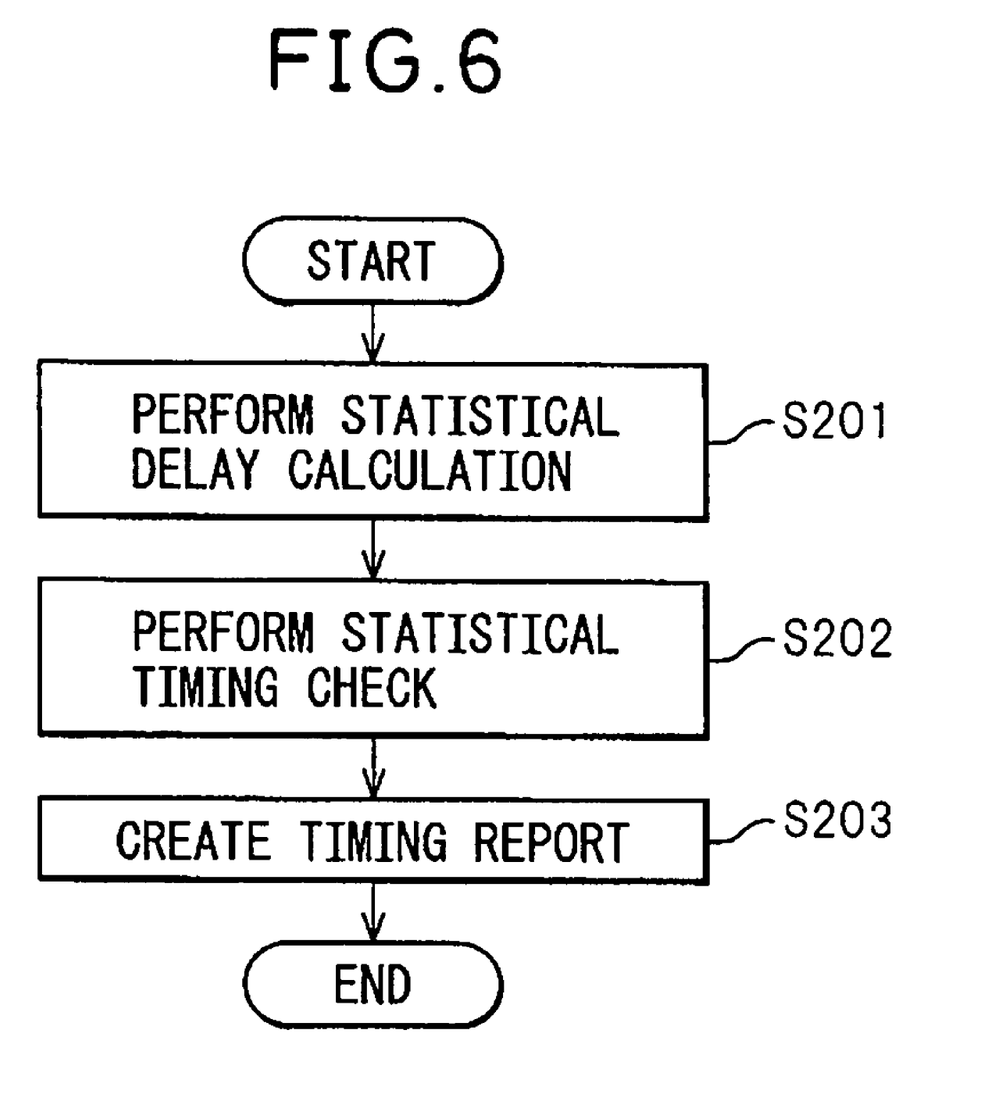
FIG. 6 is a flowchart illustrating one example of a statistical delay analysis process flow performed by the delay variation analysis apparatus.

Next, one example of a process flow of the circuit delay analysis using SSTA, performed by the delay variation analysis apparatus 10, will be described with reference to FIG. 6.

In the prior art, to perform SSTA, Monte Carlo analysis has had to be performed in order to obtain the probability distributions of all the circuit cells or all the devices. By contrast, in the present embodiment, since the probability distribution of an N-stage circuit cell can be generated in a simple manner, the SSTA of a circuit (for example, an integrated circuit) containing a plurality of N-stage circuit cells can be performed in a further simple manner by using the thus generated probability distribution of the N-stage circuit cell.

The statistical delay analyzer 26 performs SSTA for statistical delay calculation by using the delay time distributions of the plurality of N-stage circuit cells (statistical delay data 36) (step S201).

Figure 7:
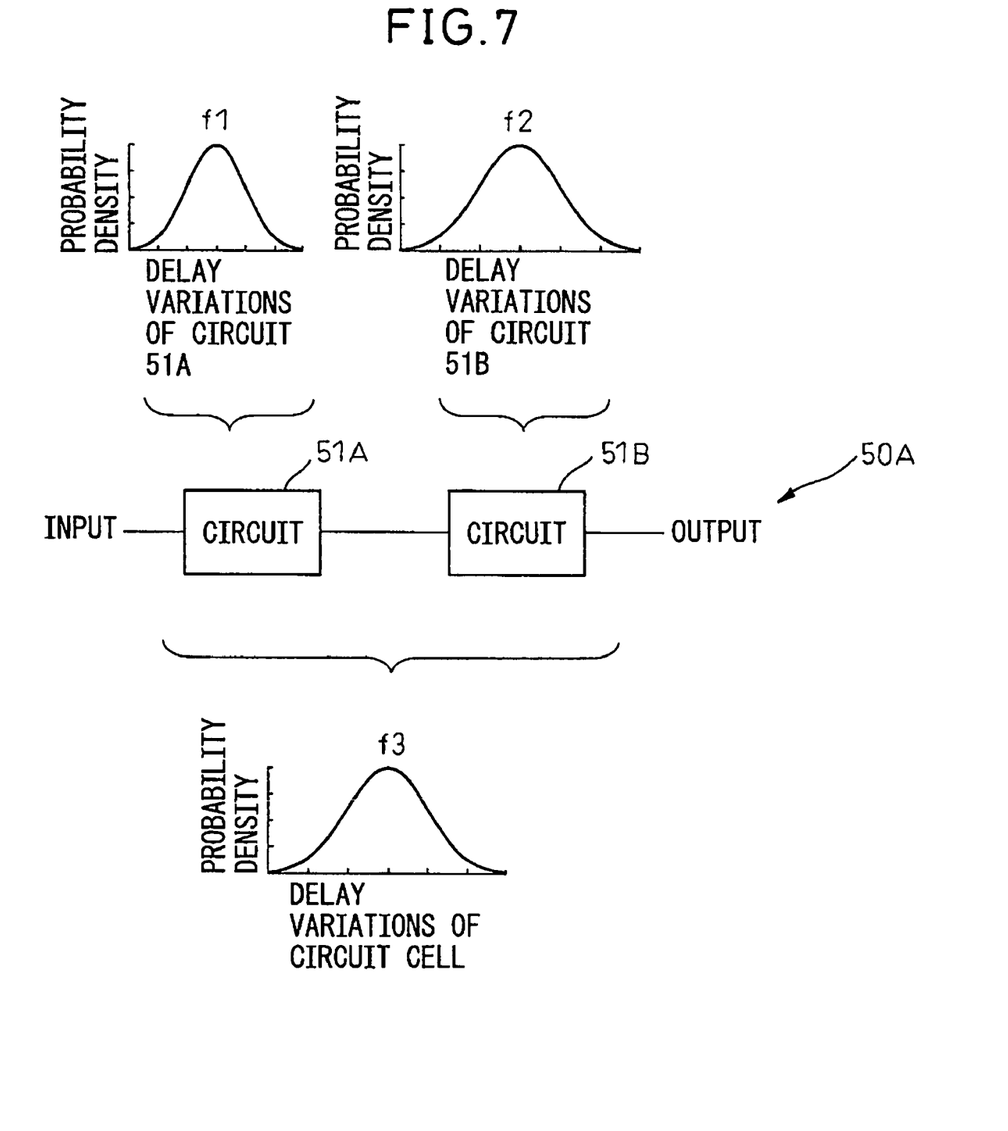
FIG. 7 is a diagram illustrating one example of a series circuit and its delay time distribution.
Figure 8:
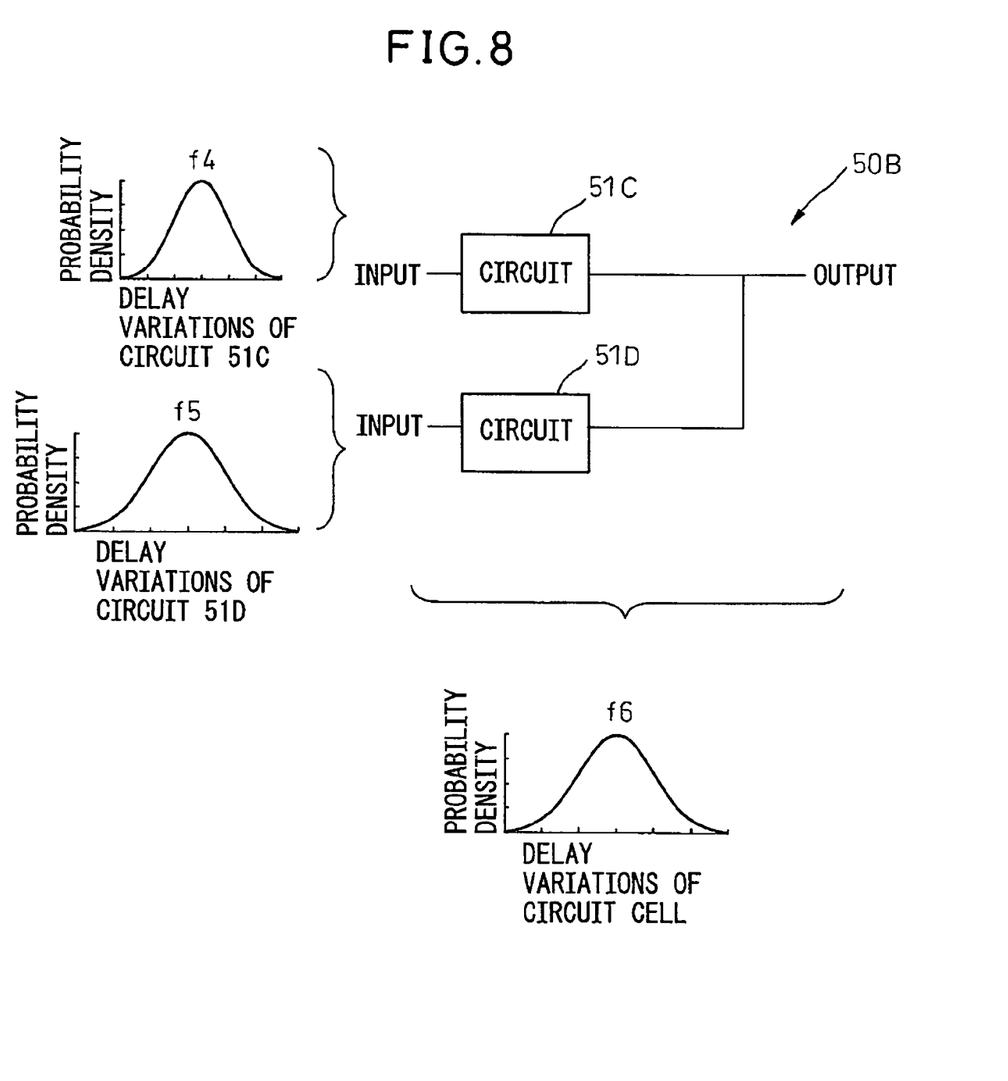
FIG. 8 is a diagram illustrating one example of a parallel circuit and its delay time distribution.

As one example of the SSTA process, FIG. 7 illustrates circuits 51A and 51B constructed by connecting the N-stage circuit cells in series and their probability distributions, and FIG. 8 illustrates circuits 51C and 51D constructed by connecting the N-stage circuit cells in parallel and their probability distributions.

As illustrated in FIG. 7, when the circuits 51A and 51B are connected in series, denoting the delay time distributions of the respective circuits 51A and 51B by f1 and f2, respectively, the delay time distribution, f3, of the circuit 50A can be obtained by calculating Equation 10 below, which is generally called a statistical sum operation.

On the other hand, as illustrated in FIG. 8, when the circuits 51C and 51D merge together, denoting the delay time distributions of the respective circuits 51C and 51D by f4 and f5, respectively, the delay time distribution, f6, of the circuit 50B can be obtained by calculating Equation 11 below, which is generally called a statistical max operation.

Statistical sum may be given by the equation, $$F3 = \int_{-\infty}^{\infty} F1(t-s)f2(s)\,ds, \quad \text{(Equation 10)}$$

in which F1 is the probability distribution function that corresponds to the probability density function f1, and F3 is the probability distribution function that corresponds to the probability density function f3. The probability distribution function f3 that corresponds to the probability distribution function F3 is obtained by obtaining the probability distribution function F3. Statistical max may be given by the equation, $F6(t)=F4(t)F5(t)\ldots$ (Equation 11), in which F4 is the probability distribution function that corresponds to the probability density function f4, F5 is the probability distribution function that corresponds to the probability density function f5, and F6 is the probability distribution function that corresponds to the probability density function f6. The probability distribution function f6 that corresponds to the probability distribution function F6 is obtained by obtaining the probability distribution function F6.

The delay time distribution f3 or f6 calculated by the statistical sum operation is stored as the statistical delay data 36 in the storage unit 30, and can be retrieved for use, thus eliminating the need to repeat the above operation.

Figure 9:
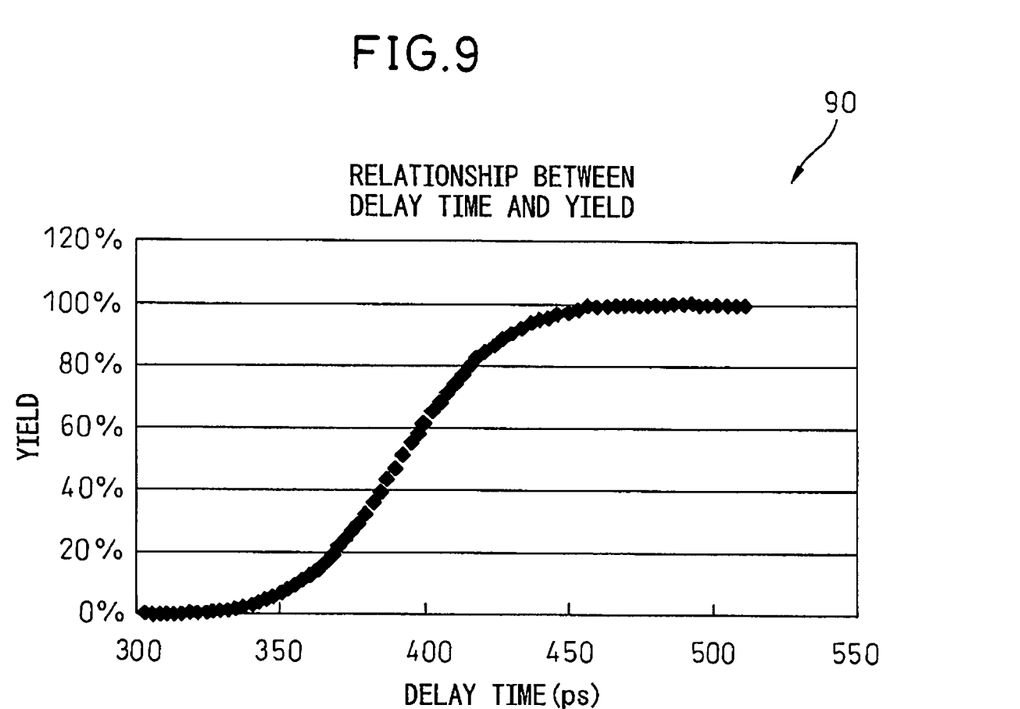
FIG. 9 is a diagram illustrating one example of the relationship between delay time and yield.

Next, the timing checker 28 performs statistical timing check based on the thus calculated delay time distribution f3 or f6 (step S202). The statistical timing check will be explained with reference to FIG. 9. FIG. 9 illustrates one example of the probability distribution function of the delay time.

The timing checker 28 can create the timing report by taking the probability density distribution 90 of the delay time when the delay time is at ±3σ corresponding to the delay time variations of ±3σ in the delay time distribution f3 or f6 (step S203). The timing checker 28 stores the probability density distribution 90 of the delay time in the storage unit 30 as the timing report 38 which can be retrieved for use, thus eliminating the need to repeat the above calculation operation.

The yield that can be achieved when the desired delay time is satisfied can be obtained by using FIG. 9. For example, when the desired delay time of the circuit 50 is 480 ps, the manufacturing yield of the circuit 50 is almost 100%.

Figure 10:
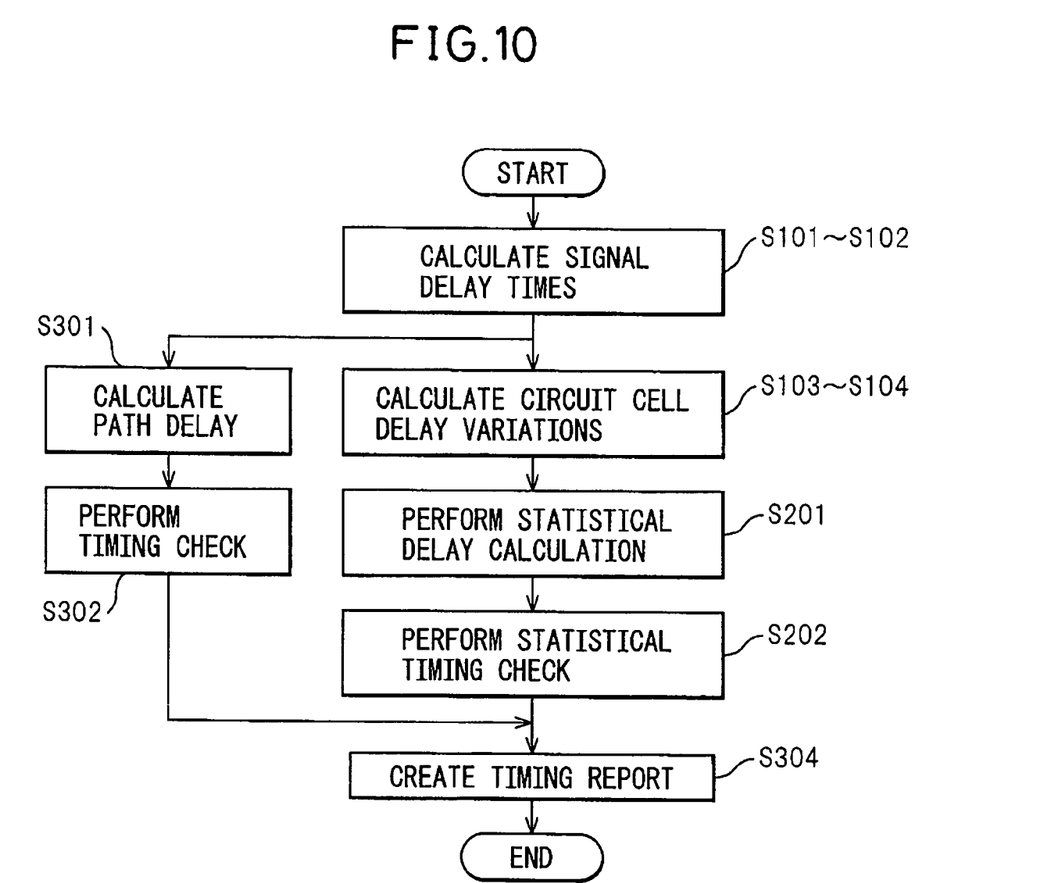
FIG. 10 is a diagram illustrating one example of a delay analysis flow that performs both SSTA and STA by the delay variation analysis apparatus.

One example of a delay analysis flow that performs both SSTA and STA will be described with reference to FIG. 10. In this embodiment, the reliability of the delay time calculated by the SSTA can be checked by creating a timing report that provides a comparison between the delay time obtained by the SSTA, as illustrated in FIG. 6, and the delay time obtained by the STA.

First, using the same design data, delay times are calculated using the process characteristics preferably for the STA and the SSTA (steps S101 and S102). In the SSTA, the process described with reference to FIGS. 4 and 6 (steps S103, S104, S201, and S202) is performed.

In the STA, using the circuit cell delay times calculated in steps S101 and S102, the overall path delay time of the circuit is calculated (step S301). The timing checker 28 gathers the path delay times calculated in step S301 and checks the operation at the desired performance (step S302). A timing report carrying both the timing check performed using the SSTA and the timing check performed using the STA is created (step S304).

As described above, in the STA, since the variation values are calculated for all the stages based on the worst-case delay time, and the values are added together, design margins for achieving the desired performance tend to be overestimated. Accordingly, by comparing the path delay times calculated by the SSTA with the path delay time distribution calculated by the STA, one can discriminate variation-resistant paths and variation-sensitive paths and can also determine for which path the delay time can be effectively improved in order to achieve the target performance or for which path the design margin has been overestimated by the STA.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. A method for analyzing a delay time distribution of an N-stage circuit, the method comprising:
    calculating, by a processor, maximum deviation delay time of a signal propagating through the circuit and basic delay time of the circuit;
    calculating, by the processor, a delay variation value of the N-stage circuit by using the mean square of differences between the maximum deviation delay time of the circuit and the basic delay time of the circuit taken over the N stages;
    generating, by the processor, the delay time distribution of the N-stage circuit as a normal distribution by using the calculated delay variation value; and
    calculating, by the processor, a sum of signal delay times through the N-stage circuit, wherein the number of stages, N, is obtained by dividing the sum of the signal delay times through the N-stage circuit by the signal delay time of a circuit stage having the longest signal delay time or the signal delay time of a kind of circuit largest in number.

2. The method as claimed in claim 1, wherein the calculating a delay variation value calculates the delay variation value of the circuit by dividing a worst-case delay time of the circuit by the product of the basic delay time of the circuit and the square root of the number of stages, N.

3. The method as claimed in claim 1, further comprising:
    performing, by the processor, statistical timing analysis using the delay time distribution in order to obtain the delay variation value of a circuit having a plurality of the N-stage circuits.

4. A method for analyzing a delay time distribution of an N-stage circuit, the method comprising:
    calculating, by a processor, maximum deviation delay time of a signal propagating through the circuit and basic delay time of the circuit;
    calculating, by the processor, a delay variation value of the N-stage circuit by using the mean square of differences between the maximum deviation delay time of the circuit and the basic delay time of the circuit taken over the N stages;
    generating, by the processor, the delay time distribution of the N-stage circuit as a normal distribution by using the calculated delay variation value;
    calculating, by the processor, a sum of signal delay times through the N-stage circuit; and
    calculating, by the processor, an average value of the basic delay time taken over a stage of the N-stage circuit,
    wherein the number of stages, N, is obtained by dividing the sum of the signal delay times through the N-stage circuit by the average value.

5. The method as claimed in claim 4, wherein the calculating a delay variation value calculates the delay variation value of the circuit by dividing a worst-case delay time of the circuit by the product of the basic delay time of the circuit and the square root of the number of stages, N.

6. The method as claimed in claim 4, further comprising:
    performing, by the processor, statistical timing analysis using the delay time distribution in order to obtain the delay variation value of a circuit having a plurality of the N-stage circuits.

7. A delay variation analysis apparatus for calculating a delay variation value of a circuit, the delay variation analysis apparatus comprising:
- a signal delay time calculator for calculating maximum deviation delay time of a signal propagating through the circuit and basic delay time of the circuit;
- a delay variation calculator for calculating the delay variation value of an N-stage circuit by using the mean square of differences between the maximum deviation delay time of the circuit and the basic delay time of the circuit taken over the N stages; and
- a statistical delay analyzer for generating a delay time distribution of the N-stage circuit as a normal distribution by using the calculated delay variation value;
- wherein the delay variation calculator calculates a sum of signal delay times through the N-stage circuit, and obtains the number of stages, N, by dividing the sum of the signal delay times through the N-stage circuit by the signal delay time of a circuit stage having the longest signal delay time or the signal delay time of a kind of circuit largest in number.

8. The apparatus as claimed in claim 7, wherein the delay variation calculator calculates the delay variation value of the circuit by dividing a worst-case delay time of the circuit by the product of the basic delay time of the circuit and the square root of the number of stages, N.

9. The apparatus as claimed in claim 7, wherein the statistical delay analyzer includes a timing checker for performing statistical timing analysis using the delay time distribution in order to obtain the delay variation value of a circuit having a plurality of the N-stage circuits.

10. A delay variation analysis apparatus for calculating a delay variation value of a circuit, the delay variation analysis apparatus comprising:
- a signal delay time calculator for calculating maximum deviation delay time of a signal propagating through the circuit and basic delay time of the circuit;
- a delay variation calculator for calculating the delay variation value of an N-stage circuit by using the mean square of differences between the maximum deviation delay time of the circuit and the basic delay time of the circuit taken over the N stages; and
- a statistical delay analyzer for generating a delay time distribution of the N-stage circuit as a normal distribution by using the calculated delay variation value;
- wherein the delay variation calculator calculates a sum of signal delay times through the N-stage circuit and an average value of the basic delay time taken over a stage of the N-stage circuit, and obtains the number of stages, N, by dividing the sum of the signal delay times through the N-stage circuit by the average value.

11. The apparatus as claimed in claim 10, wherein the delay variation calculator calculates the delay variation value of the circuit by dividing a worst-case delay time of the circuit by the product of the basic delay time of the circuit and the square root of the number of stages, N.

12. The apparatus as claimed in claim 10, wherein the statistical delay analyzer includes a timing checker for performing statistical timing analysis using the delay time distribution in order to obtain the delay variation value of a circuit having a plurality of the N-stage circuits.

* * * * *